(12) United States Patent
Maruyama et al.

(10) Patent No.: US 7,719,032 B2
(45) Date of Patent: May 18, 2010

(54) ELECTRONIC DEVICE AND ITS MANUFACTURING METHOD

(75) Inventors: Ryuichiro Maruyama, Kanagawa (JP); Masafumi Ata, Kanagawa (JP); Masashi Shiraishi, Tokyo (JP)

(73) Assignee: Sony Corporation, Tokyo (JP)

( * ) Notice: Subject to any disclaimer, the term of this patent is extended or adjusted under 35 U.S.C. 154(b) by 929 days.

(21) Appl. No.: 10/535,927

(22) PCT Filed: Nov. 5, 2003

(86) PCT No.: PCT/JP03/14117

§ 371 (c)(1),
(2), (4) Date: Feb. 17, 2006

(87) PCT Pub. No.: WO2004/047183

PCT Pub. Date: Jun. 3, 2004

(65) Prior Publication Data

US 2006/0205105 A1    Sep. 14, 2006

(30) Foreign Application Priority Data

Nov. 20, 2002  (JP) .............................. 2002-335879

(51) Int. Cl.
*H01L 21/00* (2006.01)

(52) U.S. Cl. .................. 257/213; 257/13; 257/417; 257/E21.585; 257/E23.165; 438/50; 977/762; 977/949

(58) Field of Classification Search .................. 257/13, 257/213, 417; 438/50; 977/762, 949
See application file for complete search history.

(56) References Cited

U.S. PATENT DOCUMENTS

| 6,423,583 | B1 * | 7/2002 | Avouris et al. ............... 438/132 |
| 2002/0172639 | A1 * | 11/2002 | Horiuchi et al. ........... 423/447.2 |
| 2005/0026333 | A1 * | 2/2005 | Hareland et al. ............ 438/128 |
| 2006/0204428 | A1 * | 9/2006 | Noy et al. ................ 423/445 R |
| 2008/0111164 | A1 * | 5/2008 | Awano ........................ 257/284 |
| 2009/0072223 | A1 * | 3/2009 | Awano ......................... 257/24 |

FOREIGN PATENT DOCUMENTS

WO    WO02/054505 A2    7/2002
WO    WO 2007/099642    *  9/2007

* cited by examiner

*Primary Examiner*—A. Sefer
(74) *Attorney, Agent, or Firm*—Wolf, Greenfield & Sacks, P.C.

(57) ABSTRACT

A microelectronic device and a method for producing the device can overcome the disadvantages of known electronic devices composed of carbon molecules, and can deliver performance superior to the known devices. An insulated-gate field-effect transistor includes a multi-walled carbon nanotube (10) having an outer semiconductive carbon nanotube layer (1) and an inner metallic carbon nanotube layer (2) that is partially covered by the outer semiconductive carbon nanotube layer (1). A metal source electrode (3) and a metal drain electrode (5) are brought into contact with both ends of the semiconductive carbon nanotube layer (1) while a metal gate electrode (4) is brought into contact with the metallic carbon nanotube layer (2). The space between the semiconductive carbon nanotube layer (1) and the metallic carbon nanotube layer (2) is used as a gate insulating layer. Two layers including the outer semiconductive carbon nanotube layer (1) and the inner metallic carbon nanotube layer (2) are selected from carbon nanotube layers of a multi-walled carbon nanotube. These layers are processed into a form suitable for use as the multi-walled carbon nanotube (10).

15 Claims, 9 Drawing Sheets

ELECTRONIC DEVICE AND ITS MANUFACTURING METHOD

TECHNICAL FIELD

The present invention relates to electronic devices composed of carbon molecules and methods for producing the devices.

BACKGROUND ART

A hexagonal network structure (honeycomb structure) composed of six-membered rings of carbon atoms, namely benzene rings, combined in a plane is called a graphene sheet. A large number of graphene sheets are stacked to form a graphite crystal. Graphite has high electrical conductivity equivalent to metal because delocalized n electrons can move in graphite via a conjugated system formed along the carbon chains of the hexagonal network structure (if a non-metal material exhibits high electrical conductivity equivalent to metal by, for example, the movement of delocalized n electrons, the material is assumed to be "metallic" in the description below).

On the other hand, a single-walled carbon nanotube is formed by rolling a rectangular graphene sheet into a cylinder and seamlessly combining its sides. The molecular structure of the carbon nanotube varies slightly depending on how the sheet is rolled, and its electrical properties change from semiconductive to metallic accordingly. This point is described below.

FIG. 8 is a developed view (part of a graphene sheet) for defining the molecular structure of a carbon nanotube. This sheet is rolled so that a six-membered ring 51 overlaps with another six-membered ring 52, thereby forming a single-walled carbon nanotube. Specifically, the graphene sheet is rolled so that a line segment A-A' drawn from a point A on the six-membered ring 51 to a point A' corresponding to the point A on the six-membered ring 52 becomes the circumference of the resultant cylinder.

The molecular structure of the carbon nanotube depends on the number and orientation of six-membered rings arrayed in the circumferential direction of the cylinder. This is specifically indicated by a pair of integers (n,m) in the following formula:

$$\vec{c} = n\vec{a} + m\vec{b}$$

wherein $\vec{c}$ is a position vector from the point A to the point A', and $\vec{a}$ and $\vec{b}$ are unit vectors shown in the lower right of FIG. 8.

In FIG. 8, for example, $$\vec{c} = 8\vec{a} + 2\vec{b}$$

Thus the structure of the carbon nanotube is identified by the pair of integers (8,2).

Electrons have the properties as waves. Electron waves in molecules may strengthen or weaken each other in relation to their phases. What types of electron waves strengthen or weaken each other depends on the structure of molecules. Accordingly, carbon nanotubes having different structures have different electron states permitted and therefore have different electrical properties.

Quantum mechanical calculations indicate that the electrical properties of carbon nanotubes depend largely on the above pair of integers (n,m). This has also been confirmed by experiment ("Carbon Nanotube" edited by Kazuyoshi Tanaka, Kagaku-Dojin Publishing Company, Inc., 2001, pp. 19-46).

A band gap is the energy difference between the highest occupied molecular orbit (HOMO) and lowest unoccupied molecular orbit (LUMO) of electrons. As n increases, the band gap of carbon nanotubes decreases gradually and approaches that of graphite. As a special case, if (2n+m) is a multiple of 3, the highest occupied molecular orbit (HOMO) and the lowest unoccupied molecular orbit (LUMO) become degenerate, resulting in a band gap of 0. Such a carbon nanotube is metallic.

In summary,
if 2n+m=3×i, the carbon nanotube is metallic
if 2n+m≠3×i, the carbon nanotube is semiconductive
where i is an integer. The band gap of a semiconductive carbon nanotube decreases as n increases.

Thus carbon nanotubes are an extremely attractive electronic material. They change their electronic properties from semiconductive to metallic according to the size of sheets and how the sheets are rolled, and have the possibility for controlling the band gap, which determines the performance of semiconductor devices.

If the electrical properties of carbon nanotubes become freely adjustable by controlling their structures, carbon nanotubes may replace semiconductors and metals used for many electronic components.

In addition to the above distinct electronic properties, carbon nanotubes have many excellent properties. For example, in an ultrafine linear structure like a carbon nanotube, a phenomenon called ballistic transport occurs in which electrons or holes can move at high speed without being scattered. This phenomenon can dramatically increase the operational speed of electronic components.

In addition, carbon nanotubes have the highest thermal conductivity among all substances. Carbon nanotubes may therefore solve the problem that large-scale integrated circuits (LSIs) that have a higher packing density or operate at a higher speed generate a larger amount of heat which causes malfunctions more readily.

Furthermore, carbon nanotubes have extraordinarily higher tensile and flexural strength than the existing materials. This feature is advantageous in bottom-up microfabrication.

As described above, carbon nanotubes are expected as a material with the potential for breaking through a barrier to achieving higher-speed, finer LSIs in place of conventional semiconductor technology, which is centered on inorganic materials such as silicon, but is approaching its limit.

Studies have already been started to produce electronic devices such as transistors using carbon nanotubes. Among such studies, a field-effect transistor featuring a multi-walled carbon nanotube has recently been proposed in Document 1 (The Chemical Daily, The Chemical Daily Co., Ltd., Feb. 28, 2002, p. 1).

Carbon nanotubes are classified into a single-walled carbon nanotube, which is a rolled graphene sheet, and a multi-walled carbon nanotube, which includes nested cylindrical carbon nanotubes with different diameters.

In a multi-walled carbon nanotube, inner and outer adjacent layers are separated by a distance of 0.3 to 0.4 nm. The space between the two layers is filled with π electron clouds of carbon atoms constituting six-membered rings of the individual layers. The inner and outer layers are concentrically arranged at a constant distance.

The resistance between the two layers is 100 to 10,000 times the resistance of each layer of graphene sheet in a plane.

The space between the two layers, or more layers, may be used as a gate insulating layer to produce an insulated-gate field-effect transistor.

FIG. 9 is a schematic diagram showing the structure of a field-effect transistor produced using a double-walled carbon nanotube according to Document 1 above (hereinafter referred to as a comparative example).

This field-effect transistor is composed of a double-walled carbon nanotube 61 having an inner semiconductive carbon nanotube layer 1 and an outer metallic carbon nanotube layer 2 partially covering the inner semiconductive carbon nanotube layer 1. A metal source electrode 3 and a metal drain electrode 5 are brought into contact with the semiconductive carbon nanotube layer 1 while a metal gate electrode 4 is brought into contact with the metallic carbon nanotube layer 2.

To implement transistor operation, a control gate voltage $V_G$ is applied to the metallic carbon nanotube layer 2 via the gate electrode 4 while a drain-source voltage $V_{DS}$ is applied to the semiconductive carbon nanotube layer 1 between the source electrode 3 and the drain electrode 5.

The application of gate voltage causes the injection of induced charges into the semiconductive carbon nanotube layer 1 to control the conductivity of the semiconductive carbon nanotube layer 1 between the source electrode 3 and the drain electrode 5, thereby implementing transistor operation. The space between the semiconductive carbon nanotube layer 1 and the metallic carbon nanotube layer 2 functions as an insulating layer included in a general insulated-gate field-effect transistor.

FIG. 2 shows the current-voltage (drain current $I_D$ to drain-source voltage $V_{DS}$) characteristics of the field-effect transistor according to the comparative example. The drain current $I_D$ increases as the drain-source voltage $V_{DS}$ is increased in a low region with the gate voltage $V_G$ kept constant. The drain current $I_D$ then approaches saturation, and essentially becomes constant irrespective of the voltage $V_{DS}$ after the voltage $V_{DS}$ exceeds a certain level.

In the saturation region, the drain current $I_D$ increases with increasing gate voltage $V_G$. The transistor operation can therefore be implemented by modulating the drain current $I_D$ with the gate voltage $V_G$ (the control voltage applied to the gate electrode 4).

The field-effect transistor according to the comparative example, however, provides low saturated drain current $I_D$, and therefore exhibits a low rate of increase to changes in the gate voltage $V_G$. The application of gate voltage therefore has a small effect of amplifying the drain current $I_D$. This leads to high power consumption.

This is probably because the semiconductive carbon nanotube layer 1 of the transistor according to the comparative example, as shown in FIG. 9, has regions 62 that are not included in the metallic carbon nanotube layer 2 between the source electrode 3 and the drain electrode 5. These regions 62 make it difficult to form a uniformly continuous channel between the source electrode 3 and the drain electrode 5 because the regions 62 are beyond the action of the gate voltage $V_G$.

Next, a study is made on the possibility for achieving the transistor operation of the transistor according to the comparative example by supplying current through the regions 62 beyond the action of the gate voltage $V_G$ using a tunneling effect. Specifically, the probability that the tunneling effect allows electrons to pass through the regions 62 beyond the action of the gate voltage $V_G$ is calculated with varying bias voltage E, where the regions 62 have a length of L m (the distance between the source electrode 3 or drain electrode 5 and the metallic carbon nanotube layer 2).

Single-walled carbon nanotubes have a work function of 5.15 eV (M. Shiraishi and M. Ata, Carbon, 39, 1913-1917 (2001)) and a band gap of 0.1 to 1.4 eV (C. H. Olk and J. P. Heremans, J. Material Res., 9, 259 (1994); C. T. White, D. H. Roberston, and J. W. Mintmire, Phys. Rev. B, 47, 5485 (1993)). In this calculation, the semiconductive carbon nanotube layer 1 is assumed to have a band gap of 0.4 eV.

The electrode material used is gold, which has a work function of 5.05 eV. Accordingly, an energy barrier $V_0$ of 0.1 eV occurs between the gold electrodes and the semiconductive carbon nanotube layer 1 on the assumption that the semiconductive carbon nanotube layer 1 is an intrinsic semiconductor.

Referring to FIG. 10A, when electrons pass through an energy barrier having a height of $V_0$ eV and a thickness of L m by the tunneling effect with a constant bias voltage E applied to the gold electrodes, a transmission probability T is given by the following formula (1):

$$T = \sqrt{\frac{4k^2/\kappa^2}{(1-k^2/\kappa^2)\sinh^2 \kappa L + 4(k/\kappa)^2 \cosh^2 \kappa L}} \quad (1)$$

wherein $$k = \sqrt{\frac{2mE}{\hbar^2}}$$

$$\kappa i = \sqrt{\frac{2m(E-V_0)}{\hbar^2}}$$

and m is the electron mass, namely $9.1 \times 10^{-31}$ kg.

If $E<V_0$, $\kappa i$ is an imaginary number, and T in the formula (1) decreases exponentially with increasing L. In other words, if the distance L is large, few electrons can enter the region of the semiconductive carbon nanotube layer 1, and eventually the electrons are totally reflected. The thickness (coherence length) for allowing electrons to pass through an energy barrier of 0.01 eV by the tunneling effect, that is, for allowing the formula (1) to converge, is about 2 nm according to the calculation.

Next, changes in the transmission probability T in response to changes in the height ($V_0-E$) of the barrier for electrons when L is 1.5 nm, 1 nm, and 0.5 nm were calculated, and the results are shown in FIG. 10B and Table 1. FIG. 10B and Table 1 indicate that the probability T of the transmission by the tunneling effect decreases with increasing height ($V_0-E$) and length L of the energy barrier. According to FIG. 10B and Table 1, additionally, L must be limited to about 1 nm to achieve a transmission probability T of about 50%.

TABLE 1

| $V_0 - E$ | Transmission probability (%) | | |
|---|---|---|---|
| (eV) | L = 0.5 nm | L = 1.0 nm | L = 1.5 nm |
| 0.01 | 90.5 | 63.1 | 34.6 |
| 0.02 | 89.5 | 60.9 | 32.8 |
| 0.03 | 88.3 | 58.3 | 30.9 |
| 0.04 | 86.7 | 55.3 | 28.8 |
| 0.05 | 84.6 | 51.8 | 26.5 |
| 0.06 | 81.7 | 47.7 | 23.9 |
| 0.07 | 77.6 | 42.5 | 20.8 |
| 0.08 | 70.8 | 35.8 | 17.1 |
| 0.09 | 57.9 | 26.2 | 12.2 |

As described above, the length L of the regions 62 must at least be limited to about 2 nm or less, preferably about 1 nm or less, to relieve the problem of the regions 62 5 beyond the action of the gate voltage $V_G$ with the aid of the tunneling effect. Such a length seems unattainable in view of processing accuracy.

According to the article of Document 1 above, a semiconductive carbon nanotube including fullerene containing metal atoms is used as the semiconductive carbon nanotube layer 1 to improve conductivity. The effect of improvement by the included fullerene, however, seems small in consideration that the effect by applying gate voltage acts only on an extremely thin layer near the surface of the semiconductive carbon nanotube layer 1.

In light of the above circumstances, an object of the present invention is to provide a microelectronic device that overcomes the disadvantages of known electronic devices composed of carbon molecules and that delivers performance superior to the devices, and also to provide a method for producing the device.

DISCLOSURE OF INVENTION

That is, the present invention relates to an electronic device (first electronic device) including:

a first tubular carbon molecule;

a second tubular carbon molecule that is disposed substantially in parallel with the first tubular carbon molecule, partially covers the first tubular carbon molecule, and has semiconductivity;

voltage-applying means for applying voltage to the first tubular carbon molecule;

current-input means for inputting current to the second tubular carbon molecule; and current-output means for outputting current from the second tubular carbon molecule.

The present invention also relates to another electronic device (second electronic device) including a multi-walled carbon nanotube having at least two layers. This electronic device includes:

an outer carbon nanotube having semiconductivity;

an inner carbon nanotube that is partially included in the outer carbon nanotube;

a current-input terminal that inputs current to the outer carbon nanotube;

a current-output terminal that outputs current from the outer carbon nanotube; and an electrode that applies voltage to the inner carbon nanotube.

The present invention also relates to another electronic device (third electronic device) including:

a semiconductive carbon molecule having a hollow part;

a conductor included in the carbon molecule; and voltage-applying means for applying voltage to the conductor to control the electrical state of the carbon molecule.

In addition, the present invention relates to a method for producing an electronic device (a first method for producing an electronic device) including a multi-walled carbon nanotube having at least two layers. This method includes the steps of:

supplying current to part of an outer carbon nanotube to remove the part of the layer;

providing at least one current-input means to the outer carbon nanotube;

providing at least one current-output means to the outer carbon nanotube; and providing at least one voltage-applying/inputting means to an inner carbon nanotube.

The present invention also relates to another method for producing an electronic device (a second method for producing an electronic device) including a multi-walled carbon nanotube having at least two layers. This method includes the steps of:

partially drawing out an inner carbon nanotube in the axial direction thereof;

providing at least one current-input means to an outer carbon nanotube;

providing at least one current-output means to the outer carbon nanotube; and providing at least one voltage-applying/inputting means to the inner carbon nanotube.

The present invention also relates to another method for producing an electronic device (a third method for producing an electronic device). This method includes the steps of:

forming a composite of a semiconductive carbon molecule having a hollow part and a conductor included in the hollow part; and providing applying means for applying voltage to the conductor.

According to the present invention, the first outer tubular carbon molecule, the outer carbon nanotube, or the outer semiconductive carbon molecule (hereinafter referred to as a first semiconductive component) partially covers or includes the second tubular carbon molecule, the carbon nanotube, or the conductor (hereinafter referred to as a second component). The second component is supplied with the voltage to control the electrical state of the first component effectively.

The first and second components of the first electronic device are composed of the tubular carbon molecules. The first and second components of the second electronic device are composed of carbon nanotubes included in the multi-walled carbon nanotube. The first component of the third electronic device is composed of the semiconductive carbon molecule having the hollow part while the second component of the third electronic device is composed of the conductor.

The input/output current of the first component is therefore controlled with the voltage effectively by providing voltage-applying means for applying the voltage to the second component and providing current-input means for inputting the current and current-output means for outputting the current to the first component.

The materials used in the first and second methods for producing an electronic device according to the present invention are the carbon nanotubes included in the multi-walled carbon nanotube having at least two layers. The first method for producing an electronic device includes the step of supplying current to part of the outer carbon nanotube to remove the part of the layer, thereby exposing an inner carbon nanotube. The second method for producing an electronic device includes the step of partially drawing out an inner carbon nanotube in the axial direction thereof to expose the inner carbon nanotube.

In either method, carbon nanotubes suitable for the first and second components are selected from the carbon nanotubes included in the multi-walled carbon nanotube having at least two layers. Electronic devices can therefore be produced readily and efficiently using the carbon nanotubes.

The third method for producing an electronic device according to the present invention may be applied not only to cylindrical carbon nanotubes, but also to other various carbon molecules having a hollow part, including cup-stacked carbon nanotubes and carbon nanohorns.

BEST MODE FOR CARRYING OUT THE INVENTION

Figure 1:
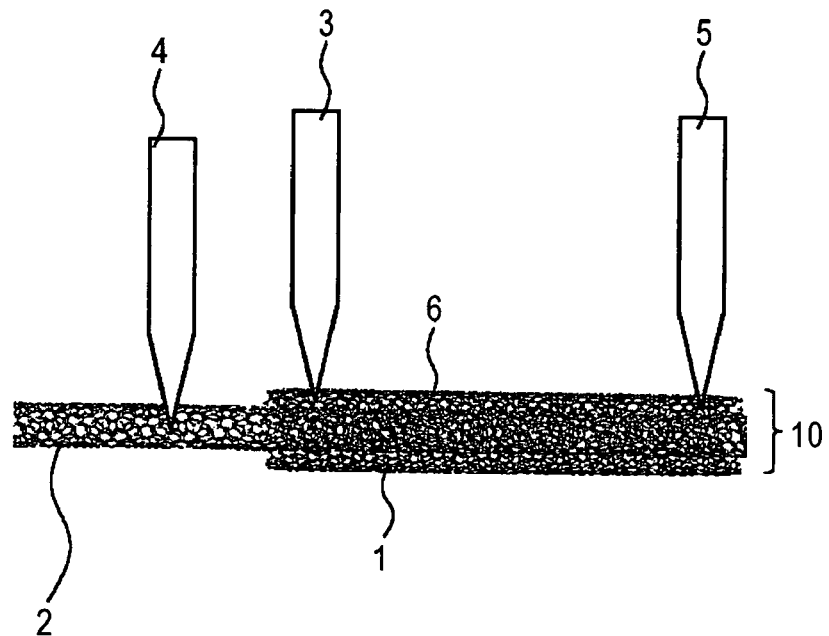
FIG. 1 is a schematic diagram showing the structure of an insulated-gate field-effect transistor according to a first embodiment of the present invention.

In the present invention, the first and second tubular carbon molecules are preferably carbon nanotubes. The first tubular carbon molecule preferably has conductivity.

The current-input means and the current-output means are preferably provided to the second tubular carbon molecule at a portion thereof covering the first tubular carbon molecule in the electronic device.

In the present invention, the electronic device preferably further includes input means for inputting current to the carbon molecule and output means for outputting current from the carbon molecule.

The input means and the output means may be provided to the carbon molecule in a region thereof covering the conductor to control the electrical properties of the overall region of the carbon molecule between the position at which the input means is connected and the position at which the output means is connected.

On the other hand, either the input means or the output means may be provided to the carbon molecule in a region thereof covering the conductor to control the electrical properties of part of the region of the carbon molecule between the position at which the input means is connected and the position at which the output means is connected.

More specifically, the electronic device is preferably an electronic device in which current flowing through the carbon molecule is controlled with the voltage applied to the conductor, for example one formed as an insulated-gate field-effect transistor.

That is, excellent current-voltage characteristics as a transistor can be provided by an insulated-gate field-effect transistor in which source and drain electrodes are provided to the carbon molecule, a gate electrode is provided to the conductor, and the space between the carbon molecule and the conductor is used as a gate insulating layer. Gate voltage acts on the overall channel region of the carbon molecule from the position at which the source electrode is connected to the position at which the drain electrode is connected to form a conduction channel with high controllability.

In the present invention, the conductor is preferably included in the hollow part of the carbon molecule with the central axes thereof in agreement in the electronic device. If the carbon molecule and the conductor have axial symmetry and are arranged with the central axes thereof in agreement, the electronic device can achieve uniform electrical properties around the central axes. In addition, no variation occurs in the action of the conductor on the carbon molecule due to variations in arrangement because the above arrangement is mechanically stable.

In the present invention, the carbon molecule used may be any semiconductive carbon molecule in principle. The carbon molecule used is exemplified by a group of materials called nanocarbons, including cylindrical carbon nanotubes, cup-stacked carbon nanotubes, and carbon nanohorns.

In addition, the conductor used may be any conductive material in principle. Examples of the material used include metallic carbon nanotubes and nanowires made of conductive materials such as metal and provided in the hollow part of the carbon molecule.

In consideration of the mass productivity and processability of current materials, preferably, a semiconductive carbon nanotube is used as the carbon molecule, a metallic carbon nanotube is used as the conductor, and these carbon nanotubes are selected from carbon nanotube layers included in a multi-walled carbon nanotube.

More specifically, a semiconductive carbon nanotube layer may be selected as the carbon molecule from the individual layers of the multi-walled carbon nanotube, and a metallic carbon nanotube layer that is positioned inside the semiconductive carbon nanotube layer and is separated by one or more semiconductive carbon nanotube layers may be selected as the conductor.

In this case, the layers other than the two selected layers may be left and need not be removed. The carbon nanotube material used may therefore be not only a double-walled carbon nanotube, but also a multi-walled carbon nanotube having three or more layers.

If an insulated-gate field-effect transistor is produced using the above multi-walled carbon nanotube, which includes the semiconductive carbon nanotube layers between the two selected layers, the space between the two selected layers is used as a gate insulating layer together with the semiconductive carbon nanotube layers.

The semiconductive carbon nanotube layers and the metallic carbon nanotube layer are preferably discriminated and selected by a scanning tunneling spectroscopy (STS) probe method and Raman microspectroscopy.

The method for producing an electronic device preferably further includes the step of partially removing the carbon nanotube layers at least once after the selection of either the carbon molecule or the conductor to process the multi-walled carbon nanotube into a shape suitable for, for example, attachment of electrodes. Specifically, the removal of the carbon nanotube layers is preferably performed by oxidation with heating by supplying current.

Alternatively, the method for producing an electronic device preferably further includes the step of partially drawing out at least one inner carbon nanotube layer included in a multi-walled carbon nanotube in the axial direction thereof with a probe of a scanning probe microscope to expose the inner carbon nanotube layer before selecting the carbon molecule and the conductor from the exposed carbon nanotube layers.

Next, preferred embodiments of the present invention will be specifically described with reference to the drawings.

First Embodiment

Insulated-Gate Field-Effect Transistor

FIG. 1 is a schematic diagram showing the structure of an insulated-gate field-effect transistor according to a first preferred embodiment of the present invention.

This field-effect transistor is composed of a multi-walled carbon nanotube 10 having an outer semiconductive carbon nanotube layer 1 and an inner metallic carbon nanotube layer 2 that is partially covered by the semiconductive carbon nanotube layer 1. A metal source electrode 3 and a metal drain electrode 5 are brought into contact with both ends of the semiconductive carbon nanotube layer 1 while a metal gate electrode 4 is brought into contact with the metallic carbon nanotube layer 2.

To implement transistor operation, a control gate voltage $V_G$ is applied to the metallic carbon nanotube layer 2 via the gate electrode 4 while a drain-source voltage $V_{DS}$ is applied to the semiconductive carbon nanotube layer 1 (channel region) between the source electrode 3 and the drain electrode 5 with the source electrode grounded. If the semiconductive carbon nanotube layer 1 is a p-type semiconductor, the gate voltage applied is positive.

The application of gate voltage causes the induction of a thin layer of negative charges, including mobile electrons, at the surface of the semiconductive carbon nanotube layer 1 to form a conduction channel between the source and the drain. The space between the metallic carbon nanotube layer 2 and the semiconductive carbon nanotube layer 1 functions as an insulating layer included in a general insulated-gate field-effect transistor.

Figure 2:
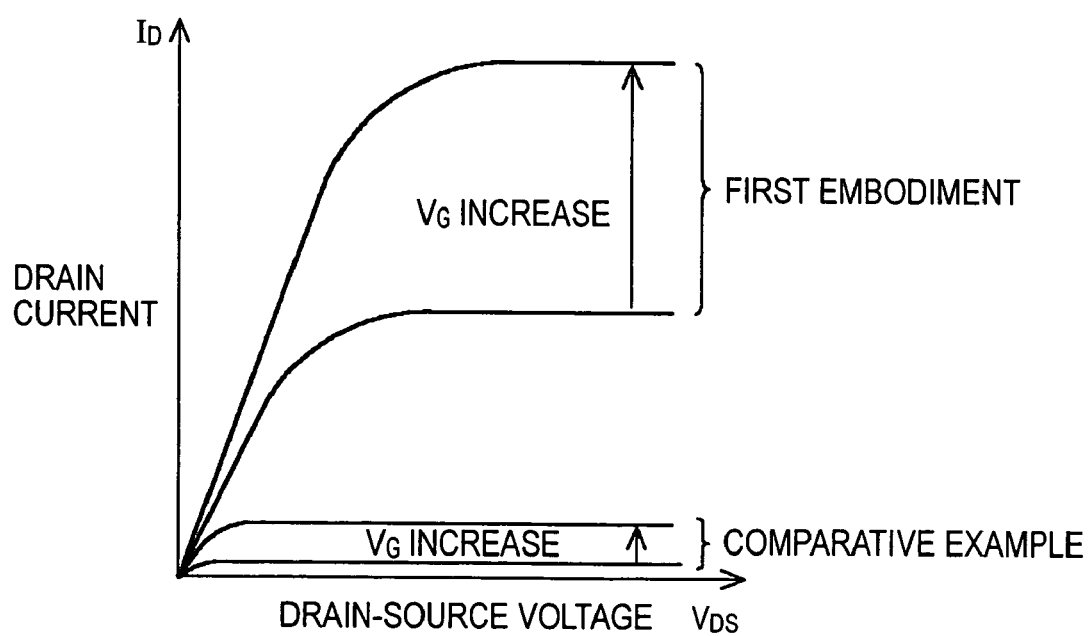
FIG. 2 is a graph showing the current-voltage (drain current $I_D$ to drain-source voltage $V_{DS}$) characteristics of the field-effect transistor according to the first embodiment and a field-effect transistor according to a comparative example.

FIG. 2 is a graph showing the current-voltage (drain current $I_D$ to drain-source voltage $V_{DS}$) characteristics of the field-effect transistor according to the first embodiment. The drain current $I_D$ increases as the drain-source voltage $V_{DS}$ is increased in a low region with the gate voltage $V_G$ kept constant. The drain current $I_D$ then approaches saturation, and essentially becomes constant irrespective of the voltage $V_{DS}$ after the voltage $V_{DS}$ exceeds a certain level.

In the saturation region, the drain current $I_D$ increases with increasing gate voltage $V_G$. The transistor operation can therefore be implemented by modulating the drain current $I_D$ with the gate voltage $V_G$ (the control voltage applied to the gate electrode 4).

According to the comparison of the current-voltage characteristics of the field-effect transistor according to the first embodiment with those of the field-effect transistor according to the comparative example, the saturated drain current $I_D$ is higher, and therefore results in a higher rate of increase (gain) to changes in the gate voltage $V_G$. This is probably because the overall channel region between the source and the drain receives the action of the gate voltage to form a conduction channel with high controllability in the transistor according to this embodiment.

As a modified embodiment, the transistor operation may also be achieved using a carbon nanotube layer having both semiconductive and metallic properties instead of the metallic carbon nanotube layer 2. In this case, however, the gate layer exhibits lower conductivity, thus decreasing the efficiency of charge injection by the application of the gate voltage.

Second Embodiment

Production of Insulated-Gate Field-Effect Transistor

A process of producing the insulated-gate field-effect transistor according to the first embodiment will now be described.

<Preparation of Multi-Walled Carbon Nanotube Material>

Multi-walled carbon nanotubes, as a raw material, are prepared by a known method. In thermal CVD (chemical vapor deposition), a hydrocarbon-based source gas is introduced into a reaction tube at a reaction temperature of 600° C. to 1,300° C. to grow multi-walled carbon nanotubes on a catalyst supported by, for example, zeolite placed in the reaction tube.

The catalyst used is a powder of transition-metal-based fine particles, such as iron, nickel, and cobalt. These particles are supported on the surface of zeolite by, for example, dispersing the zeolite in a mixed solution of iron acetate and cobalt acetate, allowing the zeolite to adsorb the iron acetate and the cobalt acetate, and drying the zeolite.

The reaction gas used is preferably a hydrocarbon gas such as acetylene ($C_2H_2$), which is more preferably diluted with argon gas.

Other examples of methods for synthesizing multi-walled carbon nanotubes include arc discharge, which is performed in a vacuum using a carbon electrode, and laser ablation, in which graphite is sublimated by laser irradiation.

<Processing of Carbon Nanotube and Attachment of Electrodes>

The production of the above insulated-gate field-effect transistor requires the multi-walled carbon nanotube 10, which has the outer semiconductive carbon nanotube layer 1 and the inner metallic carbon nanotube layer 2 that is partially covered by the outer semiconductive carbon nanotube layer 1. A method for selecting a multi-walled carbon nanotube suited for the production of the above transistor among various multi-walled carbon nanotubes contained in the raw material and then processing the multi-walled carbon nanotube is described below with reference to FIGS. 3A to 3C and FIGS. 4A to 4C.

The carbon nanotube is processed in a vacuum with observation using an electron microscope according to need. The semiconductive carbon nanotube layer 1 and the metallic carbon nanotube layer 2 are discriminated and selected by a scanning tunneling spectroscopy (STS) probe method and Raman microspectroscopy because the raw material includes carbon nanotube layers having various pairs of integers (n,m).

Step 1: Selection of Multi-Walled Carbon Nanotube 10

Figure 3A:
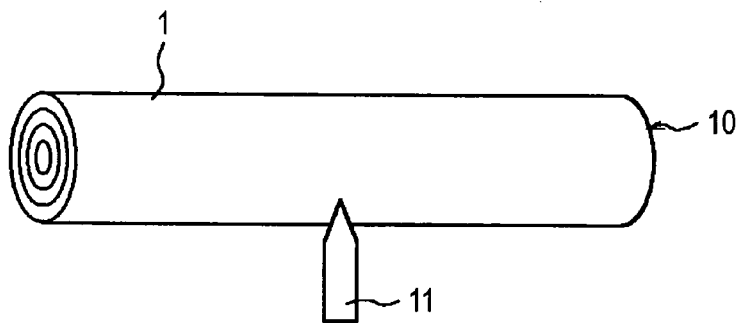
FIGS. 3A to 3C are schematic perspective views showing a process of producing an insulated-gate field-effect transistor according to a second embodiment of the present invention.

First, many multi-walled carbon nanotubes are dispersed on a substrate. Referring to FIG. 3A, a multi-walled carbon nanotube 10 having an outer semiconductive carbon nanotube layer 1 is selected using the scanning tunneling spectroscopy (STS) probe method and Raman microspectroscopy by, for example, bringing a first probe 11 into contact with the outer layer.

Step 2: Partial Removal of Semiconductive Carbon Nanotube Layer 1

Figure 3B:
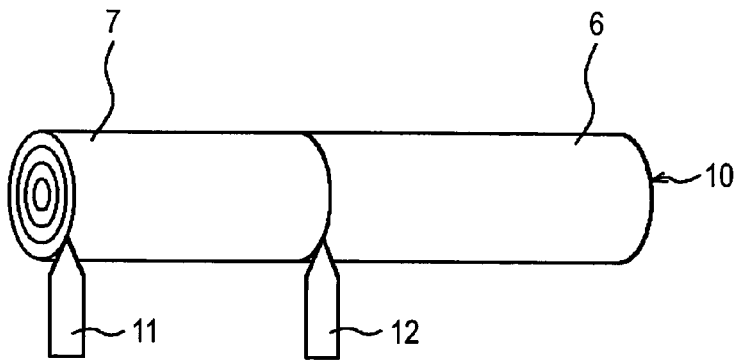
Figure 3C:
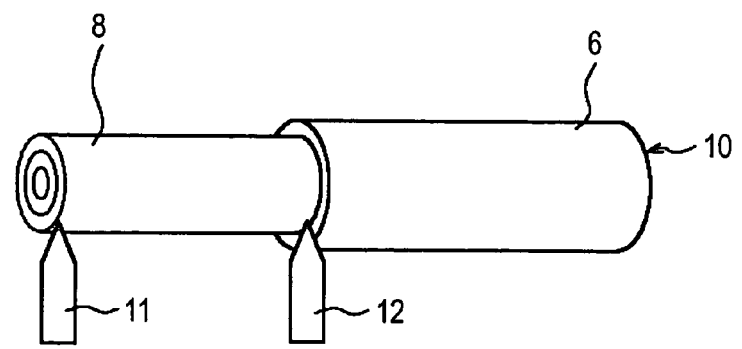

Referring to FIG. 3B, the first probe 11 and a second probe 12 are brought into contact with both ends of a removal portion 7 of the semiconductive carbon nanotube layer 1 other than the portion to be left as a channel region 6. In this state, the removal portion 7 is supplied with current by applying voltage across the two probes to generate joule heat which selectively removes the removal portion 7 by oxidation. As a result, the second outermost carbon nanotube layer 8 is exposed (in FIG. 3C).

Step 3: Selection of Carbon Nanotube Layer 8

Figure 4A:
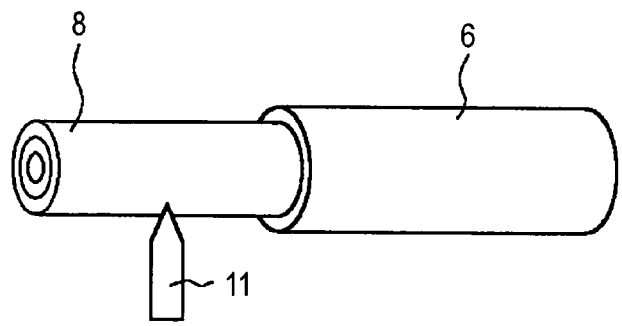
FIGS. 4A to 4C are schematic perspective views showing the process of producing an insulated-gate field-effect transistor.
Figure 4B:
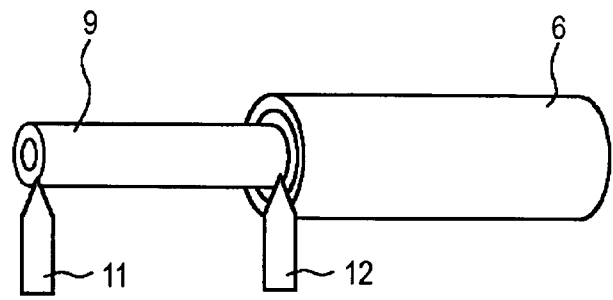

Referring to FIG. 4A, the second carbon nanotube layer 8, which has been newly exposed in Step 2, is subjected to the scanning tunneling spectroscopy (STS) probe method and Raman microspectroscopy in the same manner as in Step 1 to discriminate whether the second carbon nanotube layer 8 is a semiconductive carbon nanotube layer 1 or a metallic carbon nanotube layer 2. If the carbon nanotube layer 8 is a metallic carbon nanotube layer 2, the processing of the multi-walled carbon nanotube 10 is terminated.

Step 4: Repetition of Steps 2 and 3

If the carbon nanotube layer 8 is a semiconductive carbon nanotube layer 1, Steps 2 and 3 are repeated. That is, the carbon nanotube layer 8 is partially removed by oxidation in the same manner as in Step 2 to expose the third outermost carbon nanotube layer 9 (in FIG. 4B). This step is followed by the step of discriminating whether the third carbon nanotube layer 9 is a semiconductive carbon nanotube layer 1 or a metallic carbon nanotube layer 2.

Steps 2 and 3 are repeated to remove outer semiconductive carbon nanotube layers one by one until a metallic carbon nanotube layer 2 is exposed. The removal by oxidation is preferably performed while the conductivity of the multi-walled carbon nanotube 10 is monitored. The conductivity decreases stepwise with time, and the point of time at which the end of each step is observed corresponds to the point of time at which one or more carbon nanotube layers are removed.

Step 5: Attachment of Electrodes

Figure 4C:
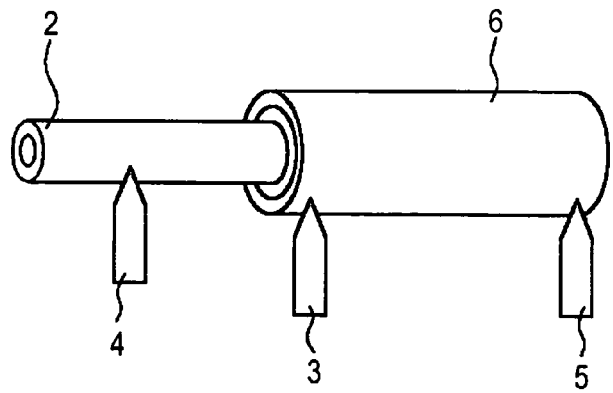

Referring to FIG. 4C, finally, electrodes are attached to the processed carbon nanotube 10 to complete the field-effect transistor. In this step, probes are brought into contact with the surface of the carbon nanotube 10 while its surface conditions are observed by scanning tunneling spectroscopy. The STS probes are then separated from the measurement equipment to use the probes as electrodes. That is, a source electrode 3 and a drain electrode 5 are brought into contact with both ends of the outer semiconductive carbon nanotube layer 1 while a gate electrode 4 is brought into contact with the inner metallic carbon nanotube layer 2.

In the example of FIG. 4C, the third outermost carbon nanotube layer 9 is the metallic carbon nanotube layer 2. In this case, the portion between the channel region 6 of the semiconductive carbon nanotube layer 1 and the metallic carbon nanotube layer 2 is used as a gate insulating layer. This portion includes the second semiconductive carbon nanotube layer 8.

In this embodiment, the multi-walled carbon nanotube 10 having the outer semiconductive carbon nanotube layer 1 is selected in advance. If a multi-walled carbon nanotube having one or more outer metallic carbon nanotube layers is used, the outer metallic carbon nanotube layers may be partially or totally removed by oxidation in the same manner as in Step 2 until a semiconductive carbon nanotube layer is exposed. The multi-walled carbon nanotube thus processed may be used in the same manner as the multi-walled carbon nanotube 10.

The method for producing an insulated-gate field-effect transistor according to the second embodiment can readily provide a high yield of insulated-gate field-effect transistors using multi-walled carbon nanotubes.

In addition, the method for producing an insulated-gate field-effect transistor involves the minimum processing of the layers other than the two layers to be necessarily processed. This method therefore includes fewer steps and provides a high yield and high productivity.

Furthermore, the method for producing an insulated-gate field-effect transistor according to the second embodiment may be applied not only to cylindrical carbon nanotubes, but also to various hollow multi-walled nanocarbons, including cup-stacked carbon nanotubes and carbon nanohorns.

Third Embodiment

Production of Insulated-Gate Field-Effect Transistor

Figure 5A:
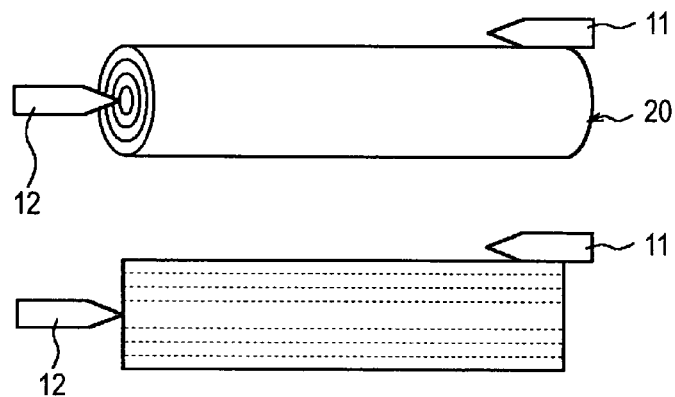
FIGS. 5A to 5C are a schematic perspective view and plan views partially showing a process of producing an insulated-gate field-effect transistor according to a third embodiment of the present invention.

Another method for producing a multi-walled carbon nanotube having the outer semiconductive carbon nanotube layer 1 and the inner metallic carbon nanotube layer 2 that is partially covered by the inner semiconductive carbon nanotube layer 1 will now be described with reference to FIGS. 5A to 5C.

First, any multi-walled carbon nanotube 20 is selected.

The outermost layer of the multi-walled carbon nanotube 20 is then fixed. A first probe 11 is brought into contact with the outermost layer of the multi-walled carbon nanotube 20 in parallel with the axial direction of the multi-walled carbon nanotube 20 in a vacuum chamber. The multi-walled carbon nanotube 20 is left to deposit carbon-containing impurities in the vacuum chamber on the contact portion so that the outermost layer of the multi-walled carbon nanotube 20 is fixed to the first probe 11.

Next, a second probe 12 is fixed to the inner layers of the multi-walled carbon nanotube 20 in the same manner as above. The second probe 12 is then drawn away from the first probe 11. As a result, a multi-walled carbon nanotube 21 having drawn inner layers can be obtained, as shown in FIG. 5B.

Figure 5B:
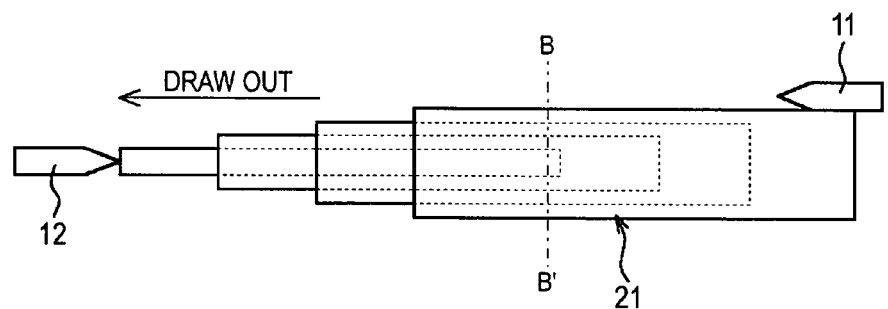
Figure 5C:
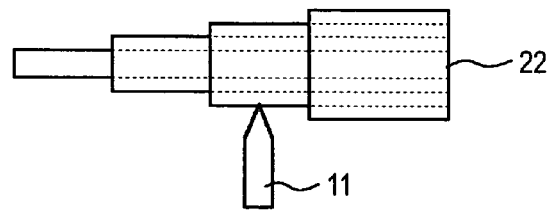

The multi-walled carbon nanotube 21 in FIG. 5B may be directly used to produce a field-effect transistor. Alternatively, if necessary, the multi-walled carbon nanotube 21 may be cut in cross-section B-B' in FIG. 5B to produce a structure shown in FIG. 5C by, for example, irradiation with electron or ion beams or heating by attaching probes to both ends of the portion to be cut and supplying current to the portion.

A multi-walled carbon nanotube 22 provided in the above steps is then subjected to the scanning tunneling spectroscopy (STS) probe method and Raman microspectroscopy in the same manner as in Step 1 in the first embodiment to select two layers including the outer semiconductive carbon nanotube layer 1 and the inner metallic carbon nanotube layer 2 in the structure of the multi-walled carbon nanotube 22.

Electrodes may be attached to the selected two layers in the same manner as in Step 5 of the production process according to the first embodiment to produce an insulated-gate field-effect transistor similar to that according to the first embodiment.

The method according to this embodiment may also be applied to a multi-walled carbon nanotube that has the outer semiconductive carbon nanotube layer 1 and is selected from many multi-walled carbon nanotubes dispersed on a substrate in the same manner as in Step 1 according to the first embodiment.

The method for producing an insulated-gate field-effect transistor according to the third embodiment can readily provide a high yield of insulated-gate field-effect transistors using multi-walled carbon nanotubes.

In addition, the method for producing an insulated-gate field-effect transistor includes fewer steps and has high productivity.

Fourth Embodiment

Figure 6A:
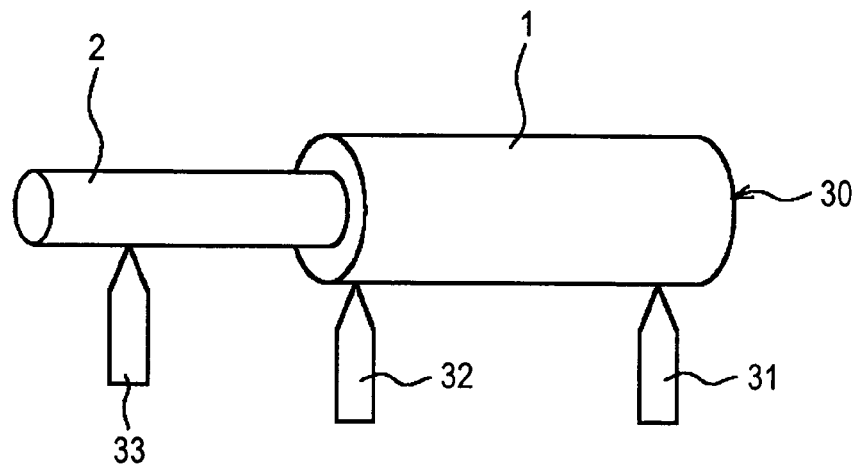
FIG. 6A is a schematic perspective view showing the structure of a current-modulation device according to a fourth embodiment of the present invention.
Figure 6B:
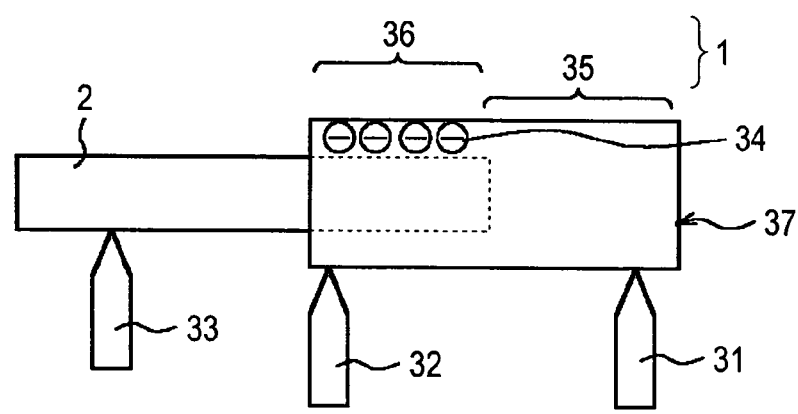
FIG. 6B is a plan view.

FIGS. 6A and 6B show a current-modulation device 37 according to a fourth preferred embodiment of the present invention. Note that a metallic carbon nanotube layer 2 of a multi-walled carbon nanotube 30 used herein reaches only part of a semiconductive carbon nanotube layer 1, in contrast to the multi-walled carbon nanotube 10 used in the production of the field-effect transistor according to the first embodiment. This multi-walled carbon nanotube 30 may be prepared by the method according to the second embodiment.

Electrodes 31 and 32 are brought into contact with the semiconductive carbon nanotube layer 1 while an electrode 33 is brought into contact with the metallic carbon nanotube layer 2. The electrode 32 is provided in a region that covers the metallic carbon nanotube layer 2 while the electrode 31 is provided in a region that does not cover the metallic carbon nanotube layer 2.

To drive this current-modulation device 37, control voltage is applied to the electrode 33 while voltage is applied across the electrodes 31 and 32. If the semiconductive carbon nanotube layer 1 is a p-type semiconductor, a positive voltage is applied to the electrode 33.

The application of a positive voltage to the metallic carbon nanotube layer 2 via the electrode 33 causes the induction of negative charges 34 at the opposite portion of the semiconductive carbon nanotube layer 1 to form an n-type region 36 adjacent to a p-type semiconductive carbon nanotube layer 35.

The conductivity of the n-type region 36 depends on the control voltage. The current flowing between the electrodes 31 and 32 is therefore modulated by the control voltage.

Fifth Embodiment

Figure 7:
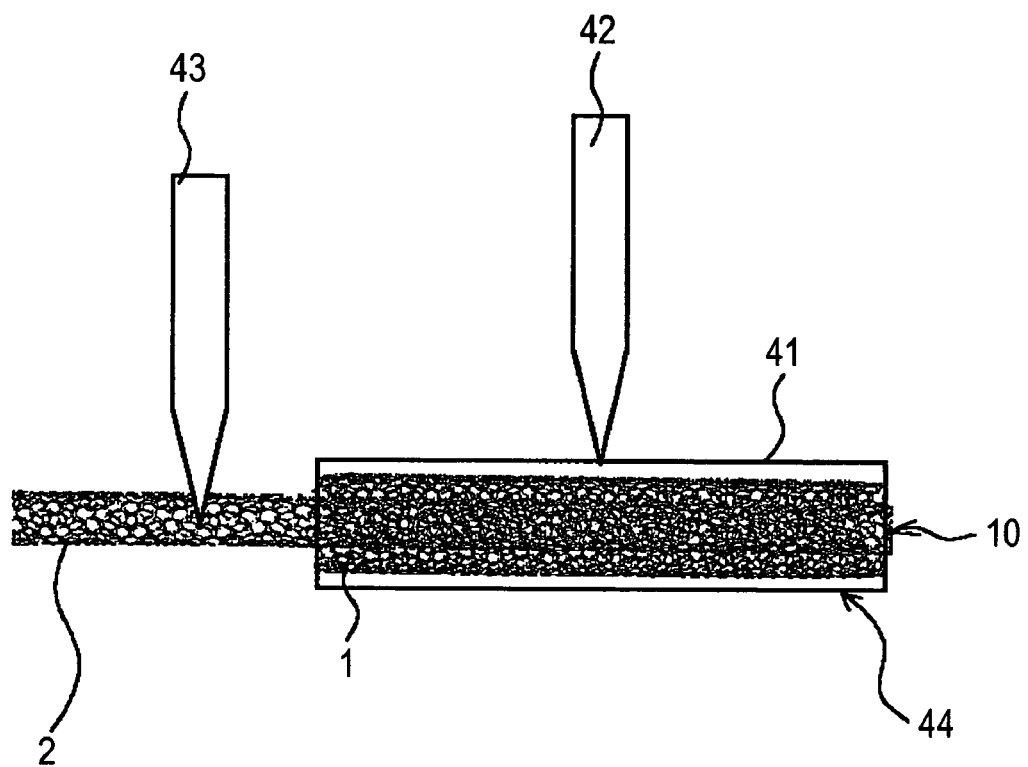
FIG. 7 is a schematic diagram showing the structure of a capacitor according to a fifth embodiment of the present invention.
Figure 8:
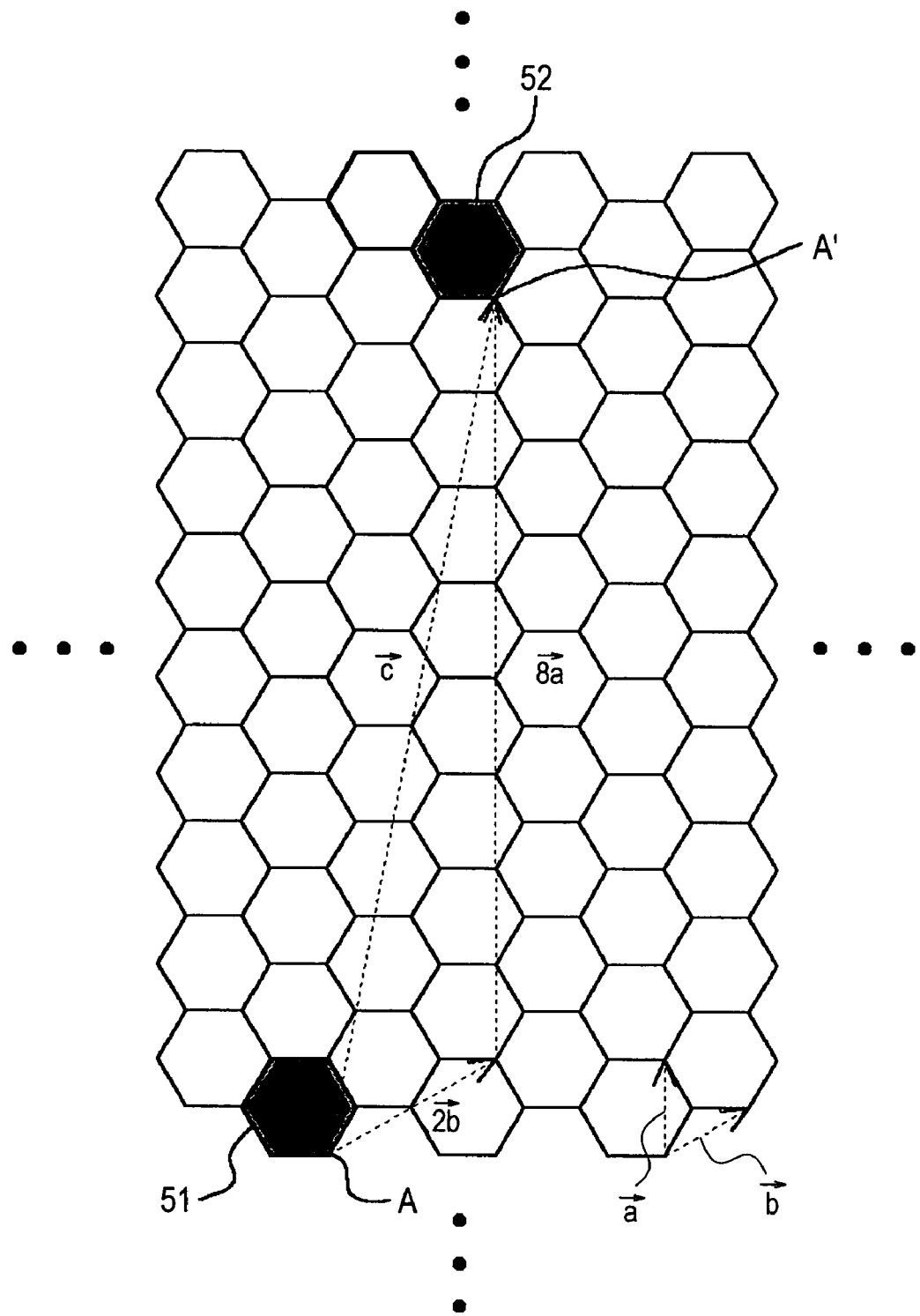
FIG. 8 is a developed view (part of a graphene sheet) for defining the molecular structure of a carbon nanotube.
Figure 9:
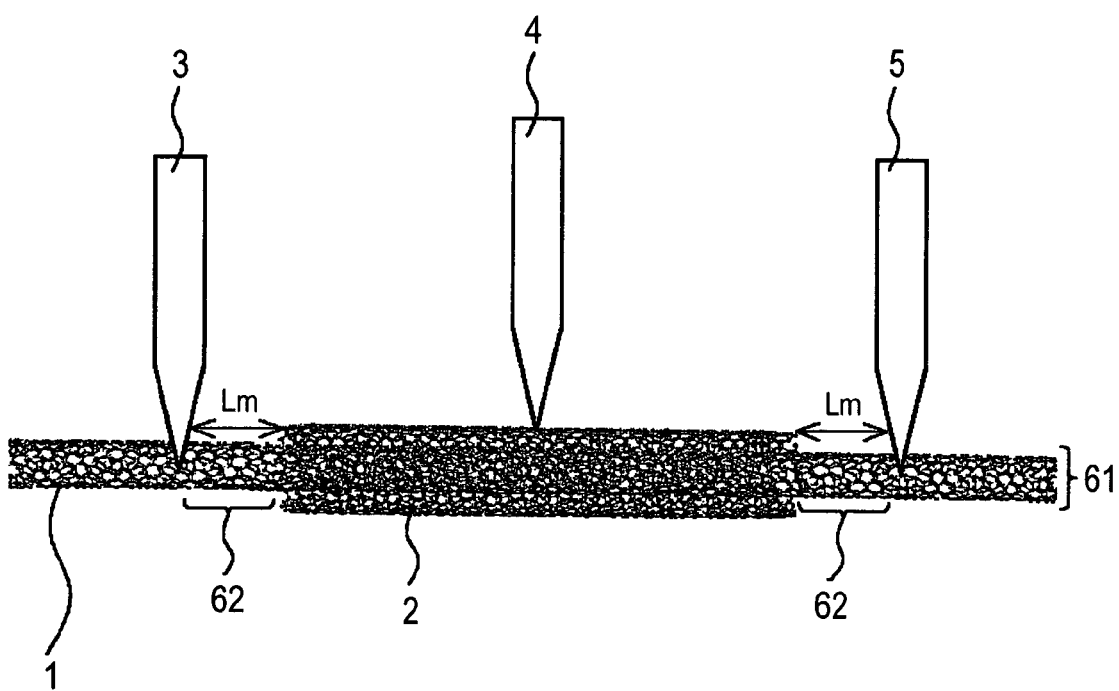
FIG. 9 is a schematic diagram showing the structure of a field-effect transistor according to a comparative example.
Figure 10A:
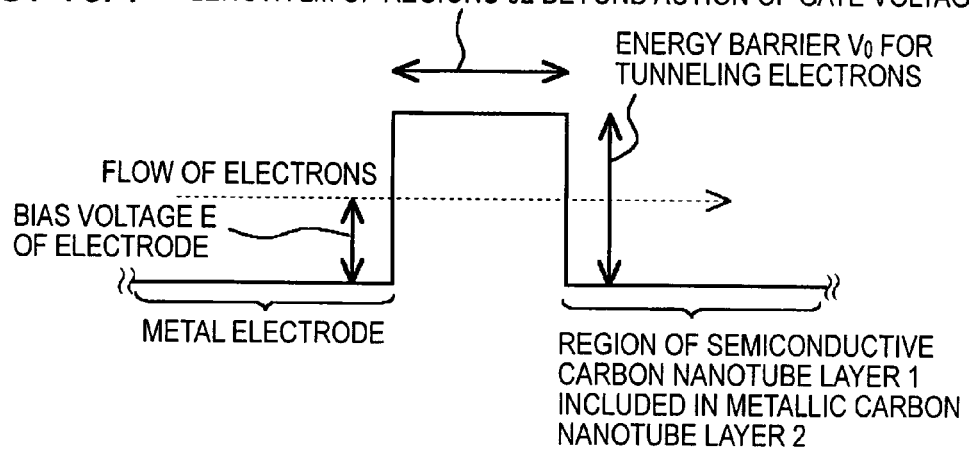
FIG. 10A is a diagram showing a tunneling effect in regions 62 beyond the action of gate voltage in the field-effect transistor according to the comparative example.
Figure 10B:
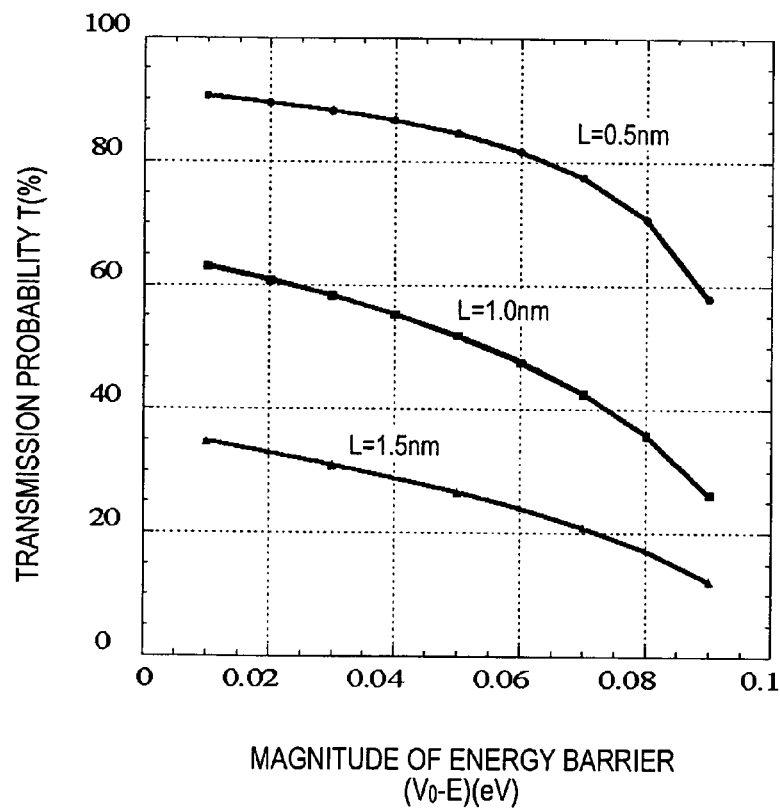
FIG. 10B is a graph showing the relationship between transmission probability and the magnitude of an energy barrier.

FIG. 7 is a nano-sized capacitor 44 according to a fifth preferred embodiment of the present invention. The structure -of the capacitor 44 is based on the multi-walled carbon nanotube 10 used in the production of the field-effect transistor according to the first embodiment. The surface of the semiconductive carbon nanotube layer 1 of the multi-walled carbon nanotube 10 is coated with a conductive material 41. An electrode 42 is connected to the conductive material 41 while an electrode 43 is connected to the metallic carbon nanotube layer 2.

The capacitor 44 functions as an extremely small capacitor.

The present invention has been described with the embodiments. Naturally, the invention is not limited to these embodiments, and may be optionally modified within the scope of the invention.

According to the present invention, the first outer semiconductive component partially covers or includes the second component. The second component is supplied with voltage to control the electrical state of the first component. The voltage applied to the second component therefore controls the electrical state of the first component effectively.

The input/output current of the first component is therefore controlled with the voltage effectively by providing voltage-applying means for applying the voltage to the second component and providing current-input means for inputting the current and current-output means for outputting the current to the first component.

The materials used in the first and second methods for producing an electronic device according to the present invention are carbon nanotubes included in the multi-walled carbon nanotube having at least two layers. The first method for producing an electronic device includes the step of supplying current to part of an outer carbon nanotube to remove the part of the layer, thereby exposing an inner carbon nanotube. The second method for producing an electronic device includes the step of partially drawing out an inner carbon nanotube in the axial direction thereof to expose the inner carbon nanotube.

In either method, carbon nanotubes suitable for the first and second components are selected from the carbon nanotubes included in the multi-walled carbon nanotube having at least two layers. Electronic devices can therefore be produced readily and efficiently using the carbon nanotubes.

The third method for producing an electronic device according to the present invention may be applied not only to cylindrical carbon nanotubes, but also to other various carbon molecules having a hollow part, including cup-stacked carbon nanotubes and carbon nanohorns.

The invention claimed is:

1. An electronic device comprising:
a first tubular carbon molecule;
a second tubular carbon molecule wherein the second tubular carbon molecule is disposed substantially in parallel with the first tubular carbon molecule, partially covers the first tubular carbon molecule, and has semiconductivity;
voltage-applying means in contact with the first tubular carbon molecule, wherein the voltage-applying means is configured to apply voltage to the first tubular carbon molecule to control operation of a conduction channel formed in the second tubular carbon molecule between current-input means and current-output means;
the current-input means for inputting current to the second tubular carbon molecule; and
the current-output means for outputting current from the second tubular carbon molecule.

2. The electronic device according to claim 1, wherein the first and second tubular carbon molecules are carbon nanotubes.

3. The electronic device according to claim 1, wherein the first tubular carbon molecule has conductivity.

4. The electronic device according to claim 1, wherein the current-input means and the current-output means are provided to the second tubular carbon molecule at a portion thereof covering the first tubular carbon molecule.

5. An electronic device including a multi-walled carbon nanotube having at least two layers, the electronic device comprising:
a field effect transistor comprising:
an outer carbon nanotube having semiconductivity;
an inner carbon nanotube that is partially included in the outer carbon nanotube;
a current-input terminal that inputs current to the outer carbon nanotube;
a current-output terminal that outputs current from the outer carbon nanotube; and
an electrode in contact with the inner carbon nanotube and applying voltage to the inner carbon nanotube to control operation of a conduction channel of the field effect transistor formed in the outer carbon nanotube between the current-input terminal and the current-output terminal.

6. An electronic device comprising a semiconductive carbon molecule comprising:
a conductive carbon molecule included in the semiconductive carbon molecule; and
voltage-applying means in contact with the conductive carbon molecule, wherein the voltage-applying means is configured to apply voltage to the conductive carbon molecule to control an electrical state of a conduction channel formed in the semiconductive carbon molecule.

7. The electronic device according to claim 6, further comprising input means for inputting current to the semiconductive carbon molecule and output means for outputting current from the semiconductive carbon molecule.

8. The electronic device according to claim 7, wherein the input means and the output means are provided to the semiconductive carbon molecule in a region thereof covering the conductive carbon molecule.

9. The electronic device according to claim 7, wherein either the input means or the output means is provided to the semiconductive carbon molecule in a region thereof covering the conductive carbon molecule.

10. The electronic device according to claim 7, configured such that current flowing through the semiconductive carbon molecule is controlled with the voltage applied to the conductive carbon molecule.

11. The electronic device according to claim 7, being formed as an insulated-gate field-effect transistor, wherein a space between the conductive carbon molecule and the semiconductive carbon molecule comprises an insulating layer.

12. The electronic device according to claim 6, wherein the conductive carbon molecule is included in a hollow part of the semiconductive carbon molecule with central axes thereof in agreement.

13. The electronic device according to claim 6, wherein the semiconductive carbon molecule is a semiconductive carbon nanotube.

14. The electronic device according to claim 6, wherein the conductive carbon molecule is a metallic carbon nanotube.

15. The electronic device according to claim 13, or 14, wherein the carbon molecule and the conductive carbon molecule are layers selected from carbon nanotube layers included in a multi-walled carbon nanotube.

* * * * *